United States Patent
Hu (10) Patent No.: US 10,896,959 B2
(45) Date of Patent: Jan. 19, 2021

(54) TOP STRUCTURE OF SUPER JUNCTION MOSFETS AND METHODS OF FABRICATION

(71) Applicant: Jun Hu, San Bruno, CA (US)

(72) Inventor: Jun Hu, San Bruno, CA (US)

(73) Assignee: HUNTECK Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/185,507

(22) Filed: Jun. 17, 2016

(65) Prior Publication Data

US 2019/0221644 A1   Jul. 18, 2019

(51) Int. Cl.
*H01L 29/10* (2006.01)
*H01L 29/06* (2006.01)
*H01L 29/78* (2006.01)
*H01L 29/08* (2006.01)
*H01L 29/40* (2006.01)

(52) U.S. Cl.
CPC ...... *H01L 29/1095* (2013.01); *H01L 29/0634* (2013.01); *H01L 29/0878* (2013.01); *H01L 29/0886* (2013.01); *H01L 29/407* (2013.01); *H01L 29/7802* (2013.01); *H01L 29/7813* (2013.01)

(58) Field of Classification Search
None
See application file for complete search history.

(56) References Cited

U.S. PATENT DOCUMENTS

2014/0110779 A1* 4/2014 Tamaki ............. H01L 29/66727
257/330

* cited by examiner

*Primary Examiner* — Jack S Chen
(74) *Attorney, Agent, or Firm* — Bo-In Lin (57) ABSTRACT

This invention discloses a semiconductor power device formed on an upper epitaxial layer of a first conductivity type supported on a semiconductor substrate. The semiconductor power device having a super junction structure with the epitaxial layer formed with a plurality of vertically extended doped columns of a second conductivity type. The semiconductor power device further comprises a plurality of transistor cells each of the transistor cells comprises a planar gate extending over a top surface and each of the planar gates further includes a middle trench gate extending vertically into the epitaxial layer from a middle portion of the planar gates. Each of the middle trench gates is surrounded by a source region of the first conductivity type encompassed in a body region of the second conductivity type extending substantially between two adjacent doped columns of the second conductivity type.

5 Claims, 13 Drawing Sheets

TOP STRUCTURE OF SUPER JUNCTION MOSFETS AND METHODS OF FABRICATION

FIELD OF THE INVENTION

The invention relates generally to semiconductor power devices. More particularly, this invention relates to new configurations and methods for manufacturing improved power device with new top structure of the metal oxide field effect transistor (MOSFT) power device such that the transistor cell pitch can be reduced to lower the resistivity while the device parameters can be flexibly adjusted to satisfy different application requirements with improved switching speed.

DESCRIPTION OF THE RELATED ART

Conventional technologies to configure and manufacture semiconductor power devices operating at the higher voltage are still confronted with difficulties and limitations. Particularly, the configurations and designs of the top structure of the metal oxide field effect transistor (MOSFET) power devices have limited margins to further reduce the cell pitches when implemented with super junction structures. In order to further improve the device performance of a power device, it is desirable for a MOSFET device with super junction structure to have reduced pitch. The reduced pitch of the super junction power device provides a benefit that the Rds_on is improved. Furthermore, a super junction power device with reduced pitch has a faster switching speed because of the reduced Crss and Coss. However, the conventional super junction MOSFET devices have a limitation that the pitch is generally defined by the space between the doped columns in the epitaxial layer. The requirements of device configuration to provide a reduced pitch therefore cannot be conveniently satisfied.

Additionally, the conventional MOSFET devices often encounter other difficulties when the pitch of the transistor cells is reduced. As the MOSFET devices having a reduced pitch which leads to a faster switching speed, the associated problems of voltage spike, gate ringing and electromagnetic interference (EMI) caused by the faster switching speed become more pronounced and must be taken into consideration. Additional design improvements are required to resolve these technical issues for the super junction MOSFET devices.

Figure 1A:
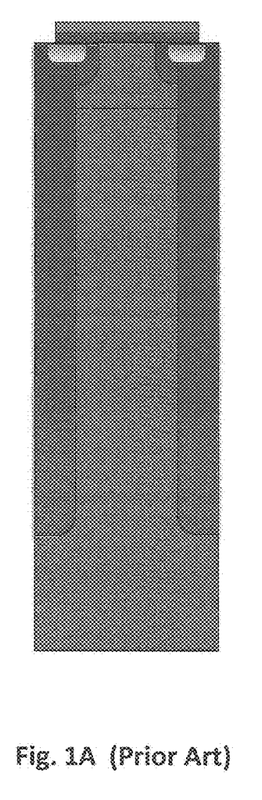
FIGS. 1A to 1B are cross sectional views showing two different top structures of the conventional super junction MOSFET devices.
Figure 1B:
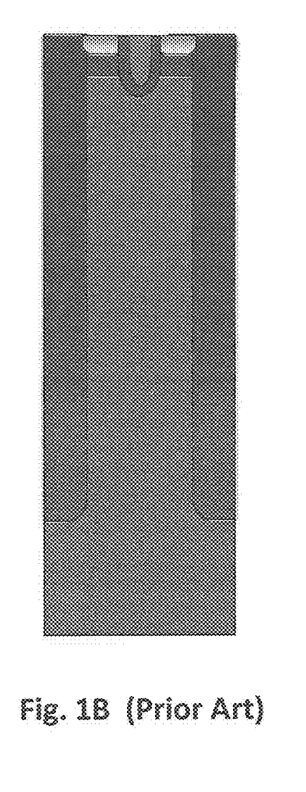

As illustrated in FIGS. 1A and 1B, the conventional MOSFET power devices with either lateral gate shown in FIG. 1A and trench gates as shown in FIG. 1B, are basically limited by the super junction structures with the transistor cells formed between the doped columns. Design improvements of the MOSFET transistor cells as illustrated in FIGS. 1A and 1B are therefore limited due to the intrinsic super junction structure near the top surface.

For the above reasons, there is a need to provide new device configurations and new manufacturing methods for the semiconductor power devices to reduce the pitch of the transistor cells with a lower resistivity without being limited by the super junction structures. Meanwhile, it is desirable that the improved device can provide adjustable Crss to resolve the technical issues of voltage spike, gate ringing and EMI concerns such that the above discussed problems and difficulties can be resolved.

SUMMARY OF THE PRESENT INVENTION

It is an aspect of the present invention to provide a new and improved device configuration and manufacturing method for providing a semiconductor power device implemented with super junction structures with improved top structure to further reduce the cell pitches. With the reduced pitches, the new and improved MOSFET cells now achieve improved Rds_on and the above discussed limitations and difficulties are overcome.

Another aspect of the present invention is to provide a new and improved device configuration and manufacturing method for providing a semiconductor power device implemented with super junction structures to have new top structure. The top structure comprises MOSFET cells implemented with planar gates that further include a middle trench gate surrounded by doped regions. The Rds_on of the devices is reduced because the JFET regions now have a lower resistance.

Specifically, an aspect of the present invention is to provide a new and improved device configuration and manufacturing method for providing a semiconductor power device implemented with super junction structures to have new top structures wherein the MOSFET cells have improved planar gates include middle shield trench gates formed in the middle portion of the planar gates extended vertically into the epitaxial layer. The middle shielded trench gates can be electrically connected to the gate terminal or the source terminal, therefore an adjustable Crss can be achieved to meeting different requirements of switch speed. With the same pitch, the Crss of new structures can be higher or lower than the traditional super junction MOSFETs.

Briefly in a preferred embodiment this invention discloses a semiconductor power device formed on an upper epitaxial layer of a first conductivity type supported on a semiconductor substrate. The semiconductor power device having a super junction structure with the epitaxial layer formed with a plurality of vertically extended doped columns of a second conductivity type. The semiconductor power device further comprises a plurality of transistor cells each of the transistor cells comprises a planar gate extending over a top surface and each of the planar gates further includes a middle trench gate extending vertically into the epitaxial layer from a middle portion of the planar gates. Each of the middle trench gates is surrounded by a source region of the first conductivity type encompassed in a body region of the second conductivity type extending substantially between two adjacent doped columns of the second conductivity type.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENTS

Figure 2:
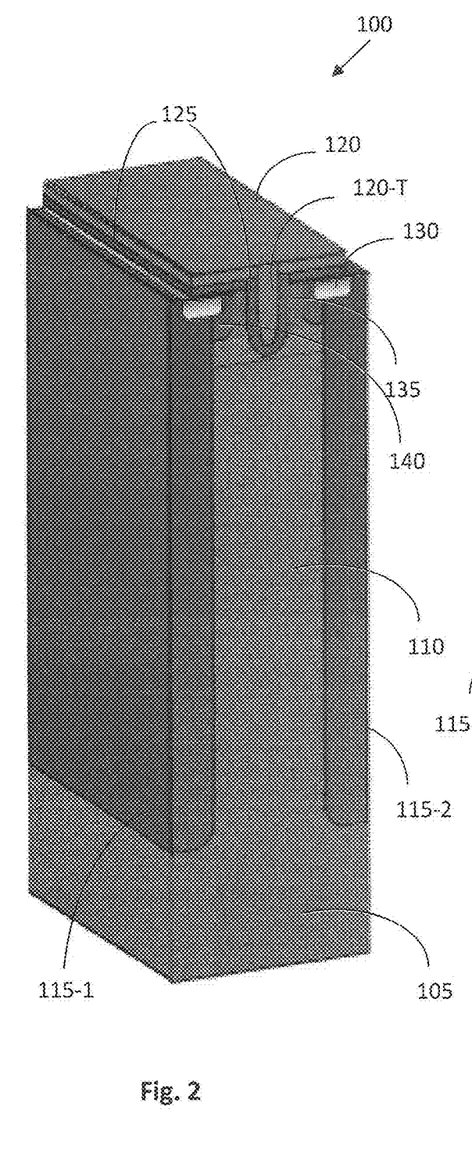
FIGS. 2 and 3 are two three dimensional views of super junction MOSFET devices implemented with improved top structure as a first and second embodiments of this invention.

FIG. 2 is a side perspective view of a MOSFET cell 100 as a preferred embodiment of this invention. The MOSFET cell is formed as a part of a semiconductor power device. The MOSFET power device including the transistor cell 100 is formed on an N-type semiconductor substrate 105 supporting an N-type epitaxial layer 110 on top of the bottom substrate layer 105. The epitaxial layer 110 is formed with a super junction structure with the epitaxial layer 110 comprises a plurality of P-columns, e.g., P-columns 115-1 and 115-2 as shown. The P-columns are separated by the 110-N regions between two adjacent P-columns. The MOSFET cell 100 includes a planar gate 120 padded by a gate oxide layer 125 underneath the planar gate 120. The planar gate 120 extends laterally on a top surface of the epitaxial layer 110 from a first P-column 115-1 to the second P-column 115-2. The MOSFET cell further includes source regions 130 encompassed in the body regions 140 disposed underneath the lateral gate 120 below the gate oxide layer 125 near the top surface of the epitaxial layer 110.

In order to improve the device performance, this invention implements a new and improved planar gate 120 with a new configuration wherein the planar gate 120 further includes a middle portion that is formed as a middle trench gate 120T. The middle trench gate 120T includes a gate polysilicon layer deposited into a trench opened in the middle portion of the planar gate 120 padded by a trench oxide layer 125T and extending vertically into the epitaxial layer 110 slightly below the bottom of the body regions 140. The middle trench gate 120T is further surrounded by an N-dopant region 135 surrounding the sidewalls of the middle trench gate 120T.

In the embodiment as shown in FIG. 2, the threshold voltage of the MOSFET device is controlled by a lateral gate channel. The device performance is improved because of the MOSFET cell has a reduced resistivity. This is achieved because the MOSFET cell with the middle trench gate 120T is surrounded by the N-dopant regions 135. Thus the MOSFET cell has a lower drain to source resistance RDS because a high JFET dopant concentration in the JFET region reduces the resistivity. Furthermore, the carrier density is increased in the JFET region when the device is turned on because there are more electrons accumulated in the JFET region under a positive gate bias. Additionally, the device has a higher Crss, i.e., a higher small-signal reverse transfer capacitance, than the conventional super-junction MOSFET device, therefore it is able to accomplish a smooth switch that is less likely to be limited by the potential problems of voltage spike, gate ringing and EMI issues.

Figure 3:
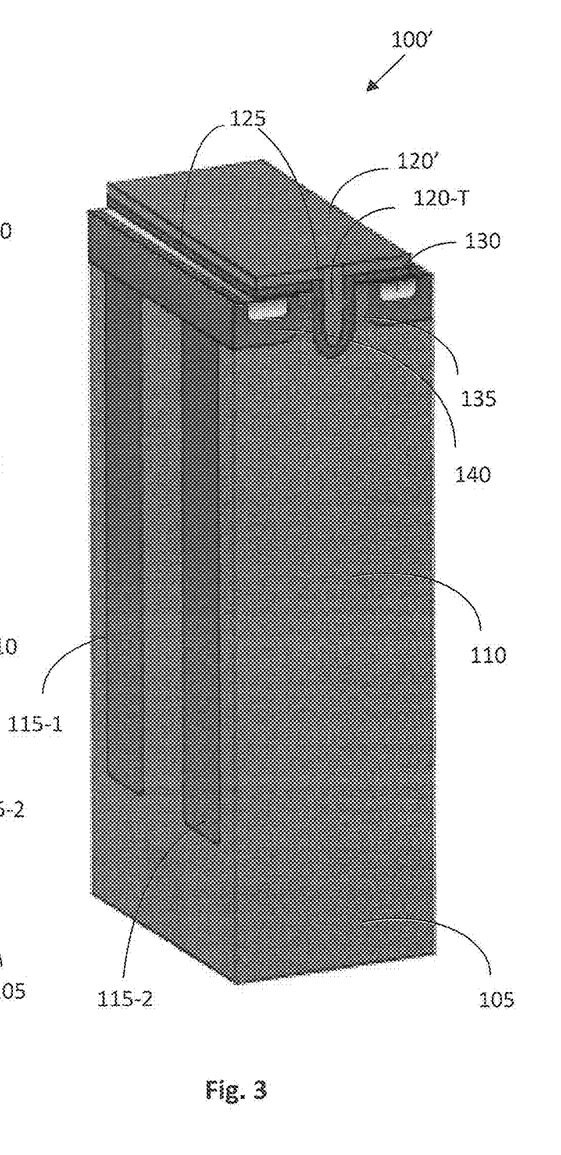

FIG. 3 is a three dimensional view of an alternate embodiment of this invention. The MOSFET cell 100' is formed on a super junction structure with the P-columns 115 similar to the device of FIG. 2. The major difference between the device 100' and the device 100 as that shown in FIG. 2 is the orientation of the MOSFET cell 100' is formed along a perpendicular direction relative to the direction of orientation of the MOSFET cell 100 of FIG. 2. Therefore, the planar gate 120' of the MOSFET cell 100' is formed with the elongate side of the planar gate 120' extending perpendicular to the P-columns 115. This configuration has the added advantage that the pitch of the MOSFET cell can be independent from the spacing of the super junction columns. Unlike the planar gate 120 of cell 100, the planar gate 120' in this embodiment can be formed with a small gate width than the spacing between the P-columns since the planar gate 120' is not formed to extend between two P-columns.

Figure 4:
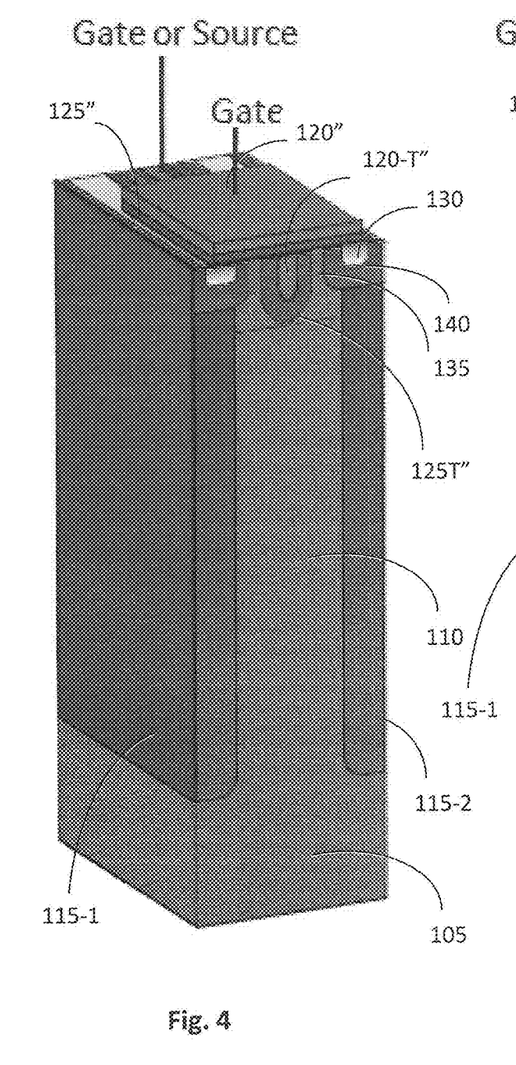
FIGS. 4 and 5 are two three dimensional views of super junction MOSFET devices implemented with improved top structure as a third and fourth embodiments of this invention and FIG. 4A is an exemplary illustration of the electrical connections of the shield trench gates (STG), some STGs are electrically connected to the source terminal and others to the gate terminal.

FIG. 4 is a three dimensional view of another alternate embodiment of this invention. The power transistor cell 100" is formed on a super junction structure with the P-columns 115 similar to the device of FIGS. 2 and 3. The major differences between the device 100" and the device 100 as that shown in FIG. 2 are the configuration of the planar gate 120" and the middle trench gate 120T". The planar gate 120" is formed with a padded gate oxide layer 125" that extends over an entire length of the planar gate 120". The middle shield trench gate 120T" is now insulated by the gate oxide layer 125" from the planar gate 120" and functioning as a middle shield trench gate (STG) 120T". The shield oxide layer 125T" may be formed with greater thickness than the gate oxide layer 125".

Figure 5:
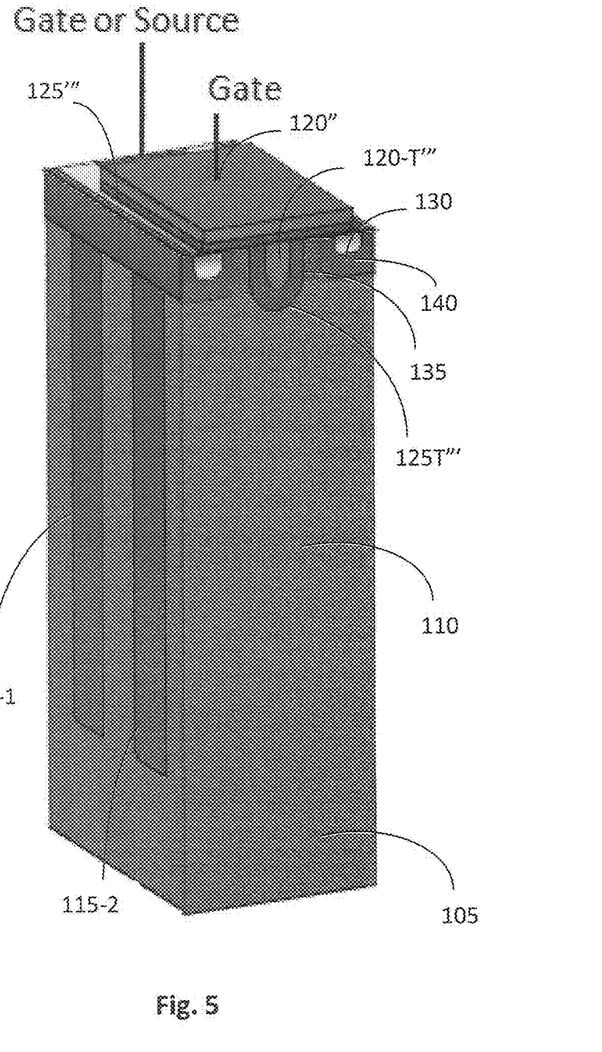

FIG. 5 is a three dimensional view of another alternate embodiment of this invention. The power transistor cell 100''' is formed on a super junction structure with the P-columns 115 similar to the device of FIGS. 2 to 4. The major differences between the device 100''' and the device 100" as that shown in FIG. 4 is the orientation of the MOSFET cell 100''' shown in FIG. 5 is formed along a perpendicular direction relative to the orientation of the MOSFET cell 100" of FIG. 4. Therefore, the planar gate 120''' of the MOSFET cell 100''' is formed with the elongate side of the planar gate 120''' extending perpendicular to the P-columns 115. This configuration has the added advantage that the pitch of the MOSFET cell 100''' can be independent from the spacing of the super junction columns. Unlike the planar gate 120" of cell 100", the planar gate 120''' in this embodiment can be formed with a small gate width than the spacing between the P-columns since the planar gate 120''' is not formed to extend between two P-columns. Similar to the MOSFET cell 100", the middle trench gate of this embodiment is also formed as middle shield-trench-gate 120T'''. The middle STG 120T''' as shown in FIG. 5 can also be shielded by a shield oxide layer 125T" and the shield oxide layer 125T''' may be formed with greater thickness than the gate oxide layer 125" to reduce the gate to drain capacitance.

Figure 4A:
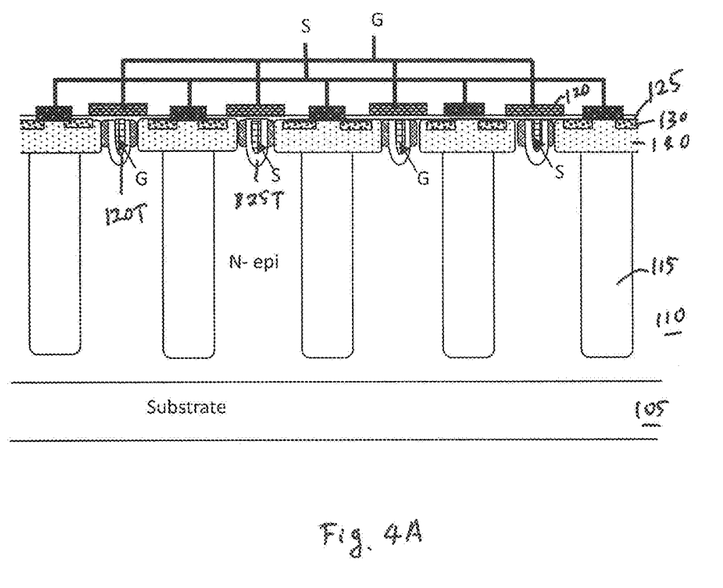

In the embodiment as shown in FIGS. 4 and 5, the threshold voltage of the MOSFET device is controlled by a lateral gate channel. The device performance is improved because of the MOSFET cell has a reduced resistivity. This is achieved because the MOSFET cell with the middle STG 120T" and 120T''' are surrounded by the N-dopant regions 135. Thus the MOSFET cell has a lower drain to source resistance RDS because of a high JFET dopant concentration in the JFET region reduces the resistivity. Furthermore, the carrier density is increased in the JFET region when the device is turned on because there are more electrons accumulated in the JFET region under a positive gate bias. Additionally, The Crss (small-signal reverse transfer capacitance) of the device is adjustable to meet different switch speed. When the STG is electrically connected to planar gate, the device has a higher Crss than the conventional super-junction MOSFET. The device therefore is able to accomplish a smooth switch and less likely to be limited by the potential problems of voltage spike, gate ringing and EMI issues. When a high switch efficiency and faster switch speed is critical, the STG can be electrically connected to the source terminal to lower the Crss. Moreover, to achieve the best trade-off between the efficiency and smooth switch, a part of the STGs can be connected to planar gate and the other can be connected to the source terminal. FIG. 4A is an exemplary illustration of the electrical connections of the shield trench gates (STG); some STGs are electrically connected to the source terminal and others to the gate terminal.

Figure 6A:
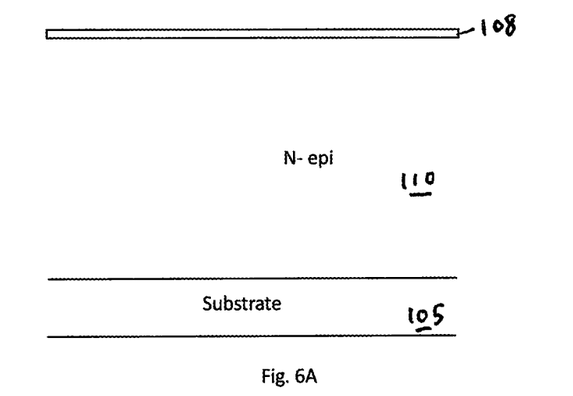
FIGS. 6A to 6J are a series of cross sectional views for illustrating the manufacturing processes of devices shown in FIGS. 2 and 3.
Figure 6B:
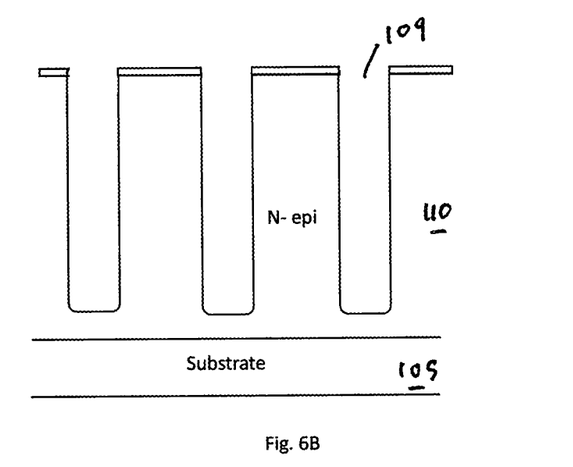
Figure 6C:
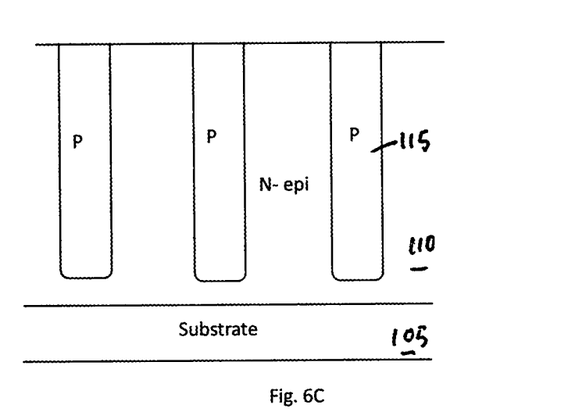
Figure 6D:
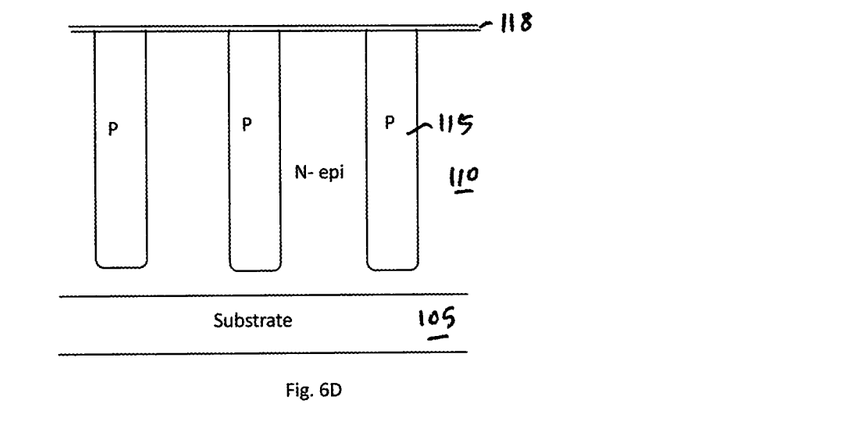
Figure 6E:
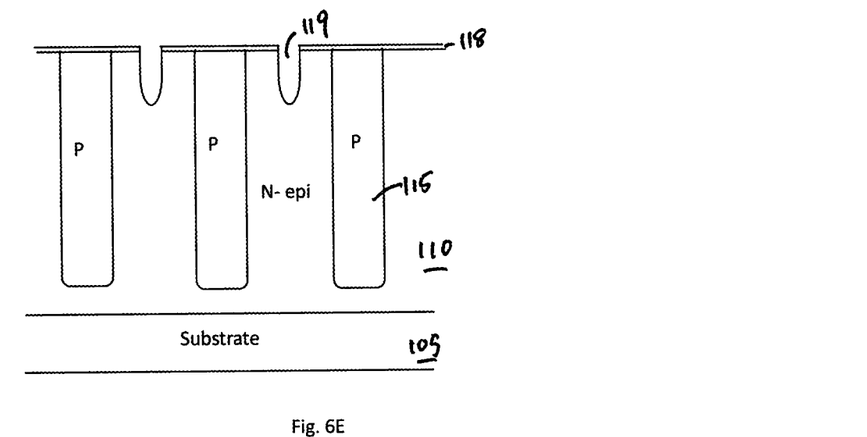

FIGS. 6A-6K are a series of cross sectional views to show the fabrication processes of a semiconductor power device shown in FIGS. 2 and 3. In FIG. 6A, a hard mask 108 is deposited at first on top of the epitaxial layer 110 supported on the silicon substrate 105. In FIG. 6B, a trench mask (not shown) is applied on top of the hard mask 108 to carry out a trench etch process to open a plurality of trenches in the epitaxial layer 110. In FIG. 6C, the hard mask 108 is removed followed by necessary steps to smooth the trench sidewalls including a sacrificial oxidation and an oxide-etch to remove the damaged surface on the trench wall. Then the trenches are filled with a P-type epitaxial layer to form P-columns 115 in the N-type epitaxial layer 110 followed by a planarization process. The P-columns can also be alternately formed by multiple epitaxial growth process with masked P-type implantation after each epitaxial growth. In FIG. 6D, a second hard mask layer 118 is deposited onto of the epitaxial layer 110 followed by applying a middle-trench mask (not shown) on top of the second hard mask layer to define the locations of the middle trenches. In FIG. 6E, a trench etch process is carried out to etch through the second hard mask and the upper portion of the epitaxial layer 110 to open a plurality of middle trenches 119 between the P-columns.

Figure 6F:
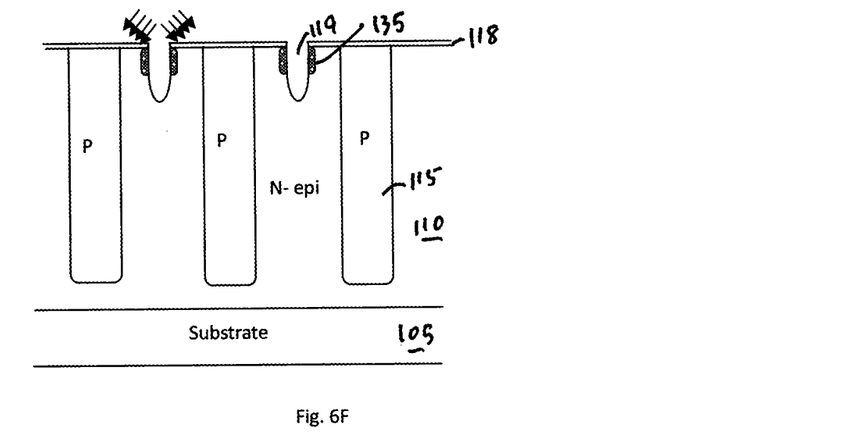
Figure 6G:
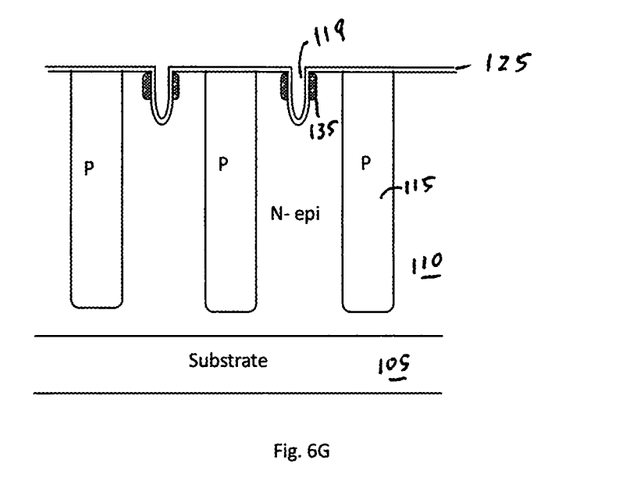
Figure 6H:
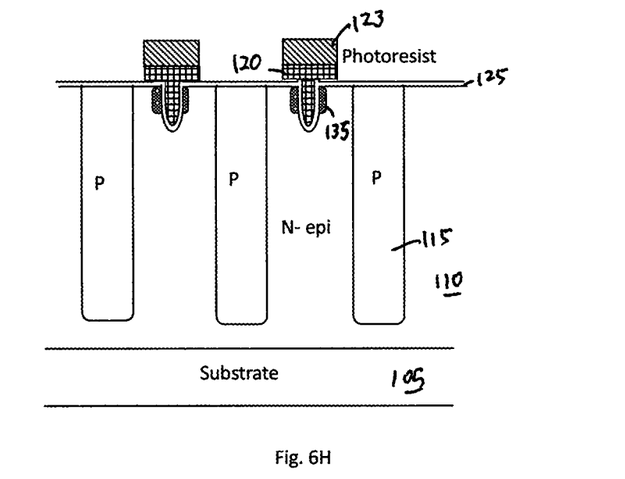
Figure 6I:
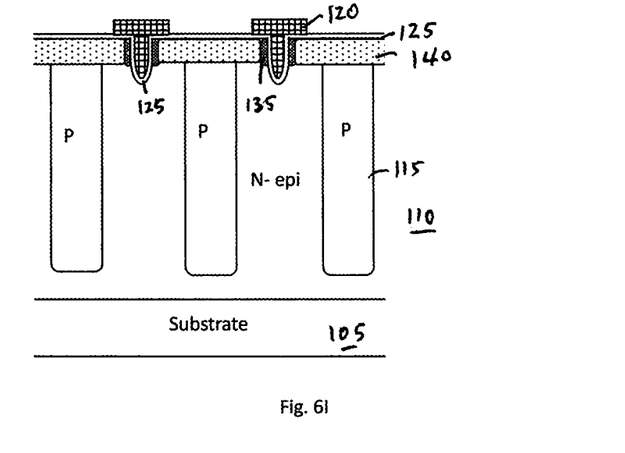
Figure 6J:
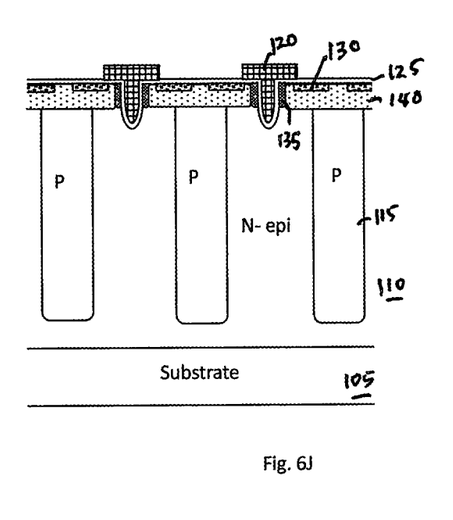

In FIG. 6F, a tilt-angle phosphorous implant is carried out to implant the JFET regions for forming the N-dopant regions 135 surrounding the sidewalls of the middle trenches 119. In FIG. 6G, a gate oxide layer 125 is deposited on top of the epitaxial layer 110 and on the sidewalls of the middle trenches 119. In FIG. 6H, a gate polysilicon layer 120 is deposited to fill the middle trenches 119 and cover the gate oxide layer 125 followed by a deposition of a photoresist layer 123. After a photolithography, the gate 120 is formed by gate polysilicon etch using the photoresist 123 as the mask. In FIG. 6I, after the photoresist is removed, a body dopant implant is carried out to form the body regions 140. In FIG. 6J, a source implant is carried out to form the source regions 130 encompassed in the body regions 140. Further processes are carried out to form the insulation layer covering over the transistor cells followed by opening contact trenches through the top insulation layer for electrically connecting to the source metals and gate pads deposited and patterned on top of the MOSFET power device. Since these processing steps are standard manufacturing steps commonly performed in the semiconductor device industry, no further descriptions are necessary.

Figure 7A:
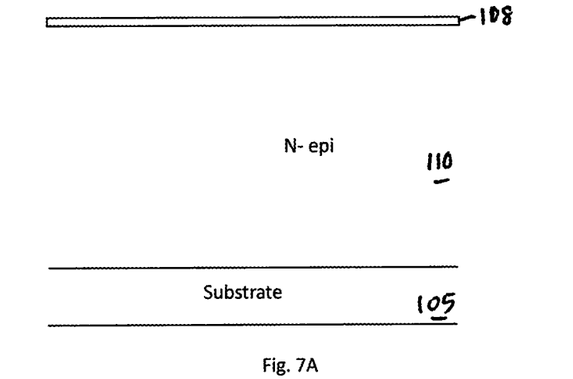
FIGS. 7A to 7K are a series of cross sectional views for illustrating the manufacturing processes of devices shown in FIGS. 4 and 5.
Figure 7B:
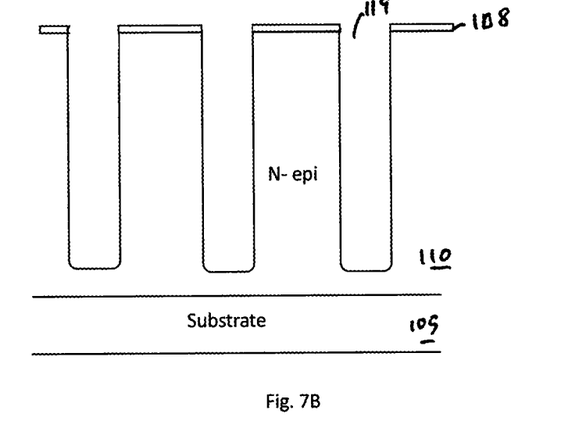
Figure 7C:
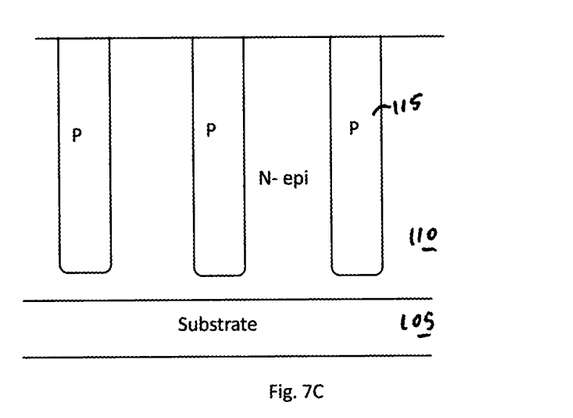
Figure 7D:
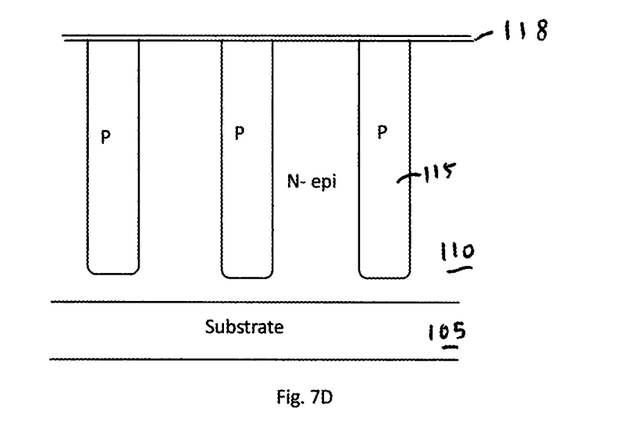
Figure 7E:
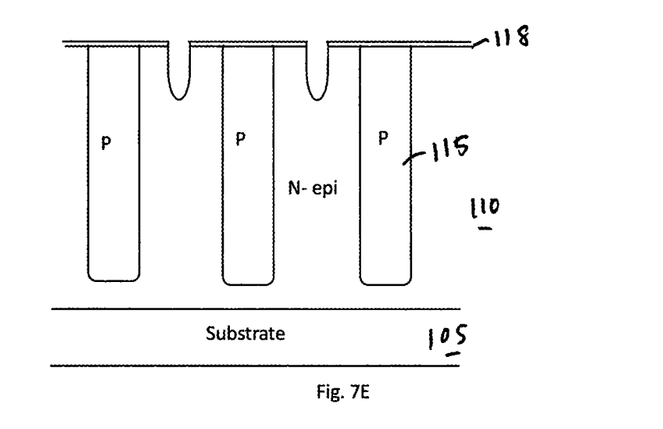

FIGS. 7A-7K are a series of cross sectional views to show the fabrication processes of a semiconductor power device shown in FIGS. 4 and 5. In FIG. 7A, a hard mask 108 is deposited at first on top of the epitaxial layer 110 supported on the silicon substrate 105. In FIG. 7B, a trench mask (not shown) is applied on top of the hard mask 108 to carry out a trench etch process to open a plurality of trenches in the epitaxial layer 110. In FIG. 7C, the hard mask 108 is removed followed by necessary steps to smooth the trench sidewalls including a sacrificial oxidation and an oxide-etch to remove the damaged surface on the trench wall. Then the trenches are filled with a P-type epitaxial layer to form P-columns 115 in the N-type epitaxial layer 110 followed by a planarization process. The P-columns can also be alternately formed by multiple epitaxial growth process with masked P-type implantation after each epitaxial growth. In FIG. 7D, a second hard mask layer 118 is deposited onto of the epitaxial layer 110 followed by applying a middle-trench mask (not shown) on top of the second hard mask layer to define the locations of the middle trenches. In FIG. 7E, a trench etch process is carried out to etch through the second hard mask and the upper portion of the epitaxial layer 110 to open a plurality of middle trenches 119 between the P-columns.

Figure 7F:
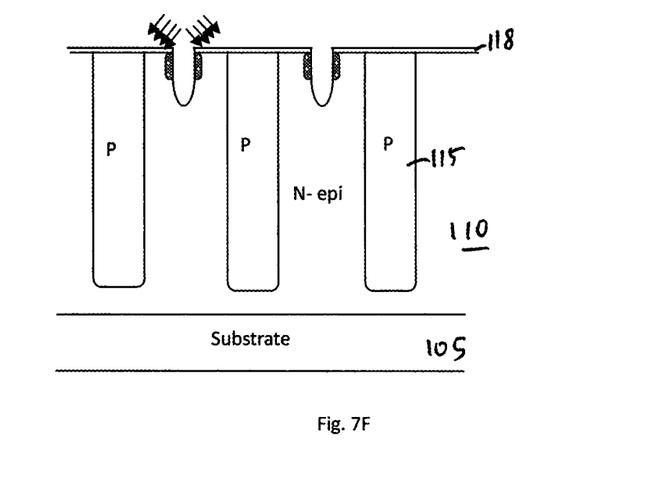
Figure 7G:
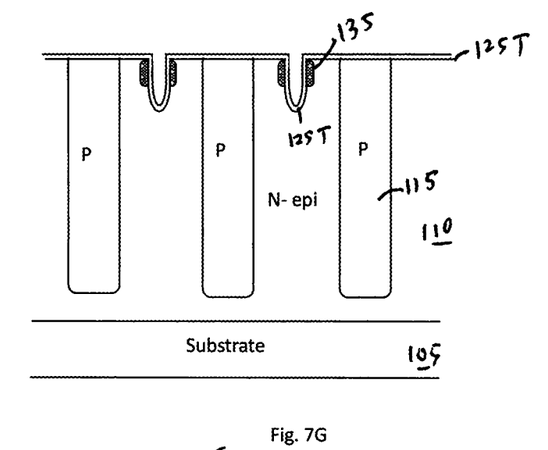
Figure 7H:
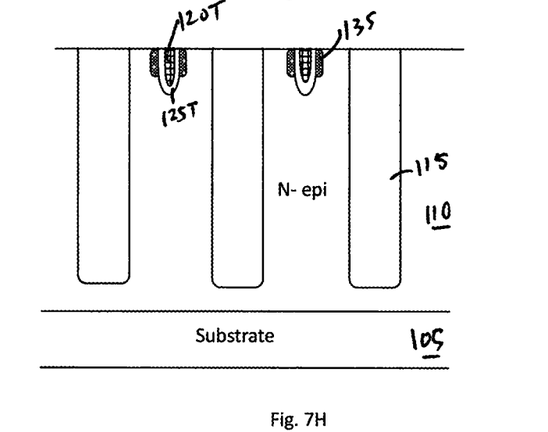
Figure 7I:
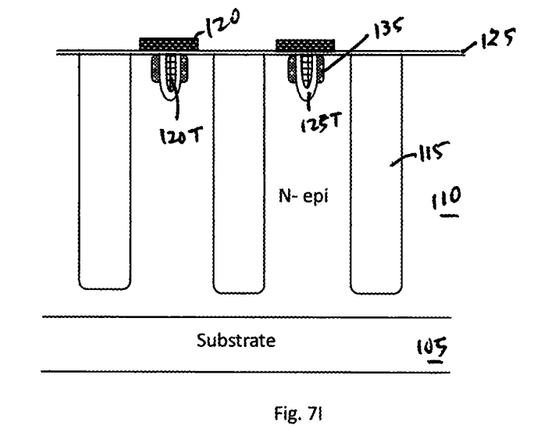
Figure 7J:
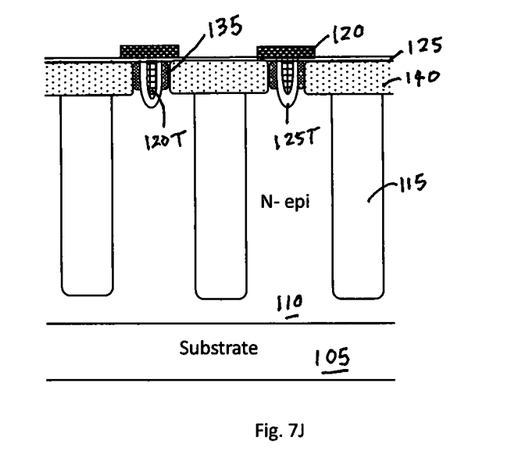
Figure 7K:
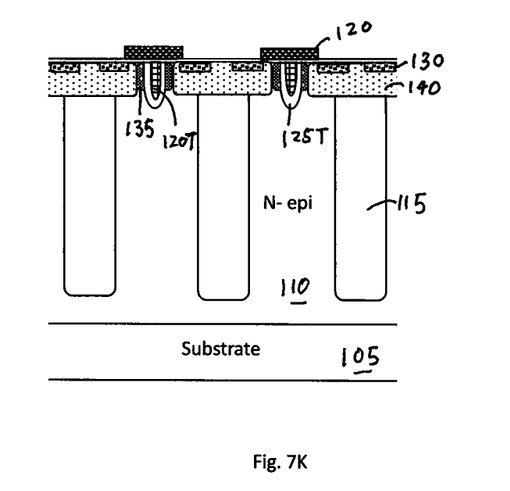

In FIG. 7F, a tilt-angle phosphorous implant is carried out to implant the JFET regions for forming the N-dopant regions 135 surrounding the sidewalls of the middle trenches 119. In FIG. 7G, after the hard mask 118 is removed, a shield oxide layer 125T is deposited on top of the epitaxial layer 110 and on the sidewalls of the middle trenches 119. In FIG. 7H, a shield trench polysilicon layer 120T is filled into the middle trenches 119 followed by applying a polysilicon and oxide etch back to remove the polysilicon and the oxide layer from the top surface above the middle shield trench gates (STG) 120T. In FIG. 7I, a gate oxide layer 125 is formed on the top surface of the epitaxial layer followed by a polysilicon deposition and then patterning the polysilicon layer into the planar gates 120 on top of the gate oxide layer 125 extending over and covering the middle STG 120T. In FIG. 7J, a body dopant implant is carried out to form the body regions 140. In FIG. 7K, a source implant is carried out to form the source regions 130 encompassed in the body regions 140. Further processes are carried out to form the insulation layer covering over the transistor cells followed by opening contact trenches through the top insulation layer for electrically connecting to the source metals and gate pads deposited and patterned on top of the MOSFET power device. Since these processing steps are standard manufacturing steps commonly performed in the semiconductor device industry, no further descriptions are necessary.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor power device formed on an upper epitaxial layer of a first conductivity type supported on a semiconductor substrate, comprising:
   a super junction structure with the epitaxial layer formed with a plurality of vertically extended doped columns of a second conductivity type wherein the doped columns of the second conductivity extend laterally along a first direction across the upper epitaxial layer;
   a plurality of transistor cells each includes a planar gate extending over a top surface along the first direction between two adjacent doped columns of the second conductivity type; and
   each of the planar gates further includes a middle trench gate extending downwardly into the epitaxial layer from a middle portion of the planar gate between two adjacent doped columns of the second conductivity type and wherein each of the middle trench gates is surrounded by a dopant region of the first conductivity type and wherein the middle trench gates and the dopant regions of the first conductivity type extending laterally along the first direction below the planar gates.

2. The semiconductor power device of claim 1 wherein:
each of the transistor cells are disposed between two adjacent doped columns of the second conductivity type extending along the first direction and further comprises a body region of the second conductivity type disposed near the doped columns of the second conductivity type and each of the transistor cells further includes a source region of the first conductivity type encompassed in the body region disposed near a top surface of the epitaxial layer underneath the planar gate.

3. The semiconductor power device of claim 1 wherein:
each of the planar gates and the middle trench gates further comprise a polysilicon layer padded by a gate oxide layer.

4. The semiconductor power device of claim 1 wherein:
the super junction structure further comprises the epitaxial layer of a N-type conductivity type with a plurality of vertically-extended doped columns of a P-type conductivity type.

5. The semiconductor power device of claim 1 wherein:
the plurality of transistor cells comprises a plurality of MOSFET cells.

* * * * *